United States Patent [19]
Terrell et al.

[11] Patent Number: 5,600,266
[45] Date of Patent: Feb. 4, 1997

[54] DIGITAL LOGIC OUTPUT BUFFER INTERFACE FOR DIFFERENT SEMICONDUCTOR TECHNOLOGIES

[75] Inventors: William C. Terrell; Robert N. Deming, both of Thousand Oaks; Russell S. Hinds, Oxnard, all of Calif.

[73] Assignee: Vitesse Semiconductor Corporation, Camarillo, Calif.

[21] Appl. No.: 575,115

[22] Filed: Dec. 19, 1995

Related U.S. Application Data

[63] Continuation of Ser. No. 496,254, Jun. 28, 1995, abandoned, which is a continuation of Ser. No. 369,316, Jan. 25, 1995, abandoned, which is a continuation of Ser. No. 187,183, Jan. 24, 1994, abandoned, which is a continuation of Ser. No. 825,109, Jan. 23, 1992, Pat. No. 5,298,808.

[51] Int. Cl.⁶ .................. H03K 19/094; H03K 17/16
[52] U.S. Cl. .................. 326/57; 326/83; 326/34
[58] Field of Search .................. 326/112, 119, 326/83, 87, 56–57, 32–34, 17; 327/541, 543

[56] References Cited

U.S. PATENT DOCUMENTS

| | | | |
|---|---|---|---|
| 4,810,969 | 3/1989 | Fulkerson | 307/450 |
| 5,066,873 | 11/1991 | Chan et al. | 307/443 |
| 5,134,316 | 7/1992 | Ta | 307/443 |

*Primary Examiner*—Edward P. Westin
*Assistant Examiner*—Jon Santamauro
*Attorney, Agent, or Firm*—Irell & Manella LLP

[57] ABSTRACT

An input buffer circuit is implemented in a compound semiconductor technology such as Gallium Arsenide and converts silicon semiconductor logic levels such as those produced by CMOS and TTL integrated circuits and converts them to logic levels compatible with circuits manufactured in compound semiconductor technology. The input buffer employs a balanced input circuit designed to produce an output voltage representing the switch-point of the compound semiconductor technology when the voltage received from a silicon semiconductor circuit equals the switch-point of the silicon semiconductor circuit. Otherwise, the output voltage of the input buffer is proportional to the difference between the voltage received from the silicon semiconductor circuit and the switch-point of the silicon semiconductor circuit. The balanced input circuit minimizes variations in its output voltage due to variations in power supply voltage, circuit temperature and process parameters. The source-follower configuration of the balanced input also neither sources current to or sinks current from the driving silicon circuit. An output buffer circuit provides a stable high impedance tri-state output in a compound semiconductor technology by eliminating the effects of leakage current common to such technologies. The circuit employs a second pull-down transistor that sinks a small leakage current, thereby positively biasing the source of a first pull-down transistor which turns the first pull-down transistor hard.

20 Claims, 7 Drawing Sheets

FIG. 7

DIGITAL LOGIC OUTPUT BUFFER INTERFACE FOR DIFFERENT SEMICONDUCTOR TECHNOLOGIES

This is a continuation of application Ser. No. 08/496,254 filed Jun. 28, 1995, now abandoned which is a continuation of Ser. No. 08/369,316 filed Jan. 25, 1995, now abandoned, which is a continuation of Ser. No. 08/187,183 filed Jan. 24, 1994, now abandoned which is a divisional of Ser. No. 07/825,109 filed Jan. 23, 1992, now U.S. Pat. No. 5,298,808.

FIELD OF THE INVENTION

The present invention relates to digital electronic circuits. More particularly, the present invention relates to an implementation of logic protocol interface between different semiconductor technologies.

BACKGROUND OF THE INVENTION

The majority of digital electronic circuits in use today are integrated circuits of varying complexity, fabricated in the semiconductor material silicon. Digital circuits are subdivided into logic families corresponding to the interface protocols to which they adhere. The most common of these logic families are TTL (transistor-transistor logic) and ECL (Emitter-coupled logic), which include specifications of power supply forms and input and output signal levels for interfacing with circuits in the same logic family.

In addition to the predominant technology which is based on silicon, other technologies are available for implementing digital integrated circuits. Among these is the compound semiconductor logic based on gallium arsenide (GaAs). GaAs logic is faster than silicon logic and can be used for this reason within silicon logic circuits to achieve great advantages. However, silicon and GaAs logic circuits are characterized by different threshold voltages, which define the interface protocols between logical high states (digital value one) and logical low states (digital value zero). Thus, any composite digital logic system must include input and output buffer circuitry to shift voltage levels between the silicon logic circuits and the GaAs logic circuits, while preserving the corresponding digital value.

FIG. 1 is a block diagram of a typical system for interfacing silicon and compound semiconductor digital logic circuits. A silicon integrated circuit 10 is connected to input buffers 16, which are in turn connected to a compound semiconductor integrated circuit 14. The input buffers 16 transform signals within the silicon logic protocols of the silicon integrated circuit 10 to corresponding input signal levels within the logic protocols of the semiconductor technology of the integrated circuit 14. Output buffers 18, which are connected between the integrated circuit 14 and a silicon integrated circuit 12, then transform the output signals generated by the integrated circuit 14 into corresponding signal levels within the logic protocols of silicon.

FIGS. 2, 3 and 4 depict typical circuits for GaAs input buffers, which are based on MESFETs. These circuits can be classified roughly into two different categories, depending on whether or not a source follower input is used. Each of the depicted circuits exhibit numerous disadvantages, which are discussed below.

The circuits of FIGS. 2 and 3 show examples of the input buffer circuits disclosed in U.S. Pat. No. 4,791,322 to Graham et al., which are based on source follower designs. Depletion mode MESFETs 20, 20a are connected as source followers with their gates serving as buffer inputs 22, 22a and their drains connected to a positive voltage supply $V_{cc}$. In FIG. 2, the source of the MESFET 20 has a conduction path to the negative voltage supply $V_{ss}$ through a diode chain 24 and to a second depletion mode MESFET 26 which is biased into conduction. Similarly, in FIG. 3, the source of MESFET 20a is connected to a negative voltage supply through a diode chain 24a and resistors 28a, 29a.

The input buffer circuits of FIGS. 2 and 3 require positive and negative voltage supplies. Standard semiconductor logic, on the other hand, is based on a single positive supply. As a result, negative voltage supplies must be externally added to any system using these input buffer circuits.

The circuits of FIGS. 2 and 3 rely on the diode chains 24 and 24a, respectively, to shift the voltage level from the driving digital logic circuit to the voltage level corresponding to the same digital value in the protocol of the driven digital logic circuit. Since the actual voltage drop depends on the drop across the individual devices, the shifted voltage level will be sensitive to process and temperature variations in the individual devices. The shifted voltages of the circuits of FIGS. 2 and 3 are also sensitive to the power supply voltages. The input signal threshold voltage of the circuit in FIG. 3 is especially dependent on $V_{ss}$. Consequently, the input to the driven digital logic circuit may not switch between low and high states when the output of the digital logic driving the circuit does so.

Finally, the circuit of FIG. 2 is poorly designed to cope with input voltages above $V_{cc}$. When input voltages exceed $V_{cc}$, the gate-to-drain diode of the MESFET 20 clamps the input at one diode drop above $V_{cc}$, i.e. approximately 5.8 volts. However, with the MESFETs 20 and 26 conducting, the path to ground via these MESFETs and the diode chain 24 corresponds to approximately 4 volts, resulting in instabilities in the input. In addition, high input voltages require that the input MESFET 20 be capable of conducting large currents, which increase the likelihood of damage to the device.

FIG. 4 shows an another typical input buffer circuit, which is disclosed in U.S. Pat. No. 4,791,322 to Graham et al. The circuit of FIG. 4 eliminates the additional negative power supplies of the circuits shown in FIGS. 2 and 3, but it also eliminates the high input impedance provided by the source follower input, creating problems of its own. The input 30 is connected to the gate of an enhancement mode MESFET 40 by means of a diode 32, which is reverse biased in the direction of the input signal to the buffer circuit, and two enhancement mode MESFETS 34, 36 connected in series. A depletion mode MESFET 38 has its drain connected to the positive voltage supply, $V_{cc}$, and its source connected to its gate and to the gate of the enhancement mode MESFET 40 through a resistor 42.

When the input 30 is taken high by the driving source, the diode 32 prevents any large current flows into the buffer circuit. However, when the input 30 swings low, the circuit sources current into the driving circuit from $V_{cc}$ via the MESFETs 34, 36, 38, the resistor 42 and the diode 32. The current sinking requirement imposed on the driving circuit by this circuit limits the capability of the driving circuit to drive multiple devices (i.e., limits the fanout of the driving circuit).

The voltage level shift from driving source logic levels to those of the buffer and internal circuitry is achieved by means of two level shifting elements. The first level shifting element is the depletion mode MESFET 38, which sources current across the MESFETs 34 and 36 and is operative for low voltage inputs. The second level shifting element, operative for high inputs, is provided by the drain current through a MESFET 44, which ensures a voltage drop across diodes 46, 48. As with the circuits of FIGS. 2 and 3, discussed above, the dependence of the circuit of FIG. 4 on the MESFET 44 and the diodes 46, 48 for the necessary level shifts makes the output voltage sensitive to process variations in the devices and to operating temperatures of the circuit. In addition, variations in the supply voltage will also effect the output voltage. Also, the circuit of FIG. 4 provides no simple way to adjust the output voltage level for different types of silicon or compound semiconductor logic.

Typical output buffers known in the art present a different set of disadvantages with regard to smooth integration between silicon and compound digital logic. For example, certain typical output buffer circuits require both positive and negative voltage supplies. As discussed above, the negative supply is not standard to silicon based logic and must be supplied externally for these circuits. Additionally, while the advantages of three state functionality are well known in the art, it has not been regularly used in output buffer circuits designed for GaAs for the reasons discussed below.

Three state functionality refers to the capability of putting a circuit's output in a high impedance state in addition to the normal high and low logic states. In this tri-state, the output is disconnected from both the power supply and ground. FIG. 5 shows a typical active high three state buffer 50. This buffer is either enabled to pass a signal from its input 52 to its output 54 or to assert the tri-state at its output 54, depending on whether its enable/disable terminal 56 is high or low.

A barrier to the implementation of tri-state functionality in GaAs technology arises from the relatively low threshold voltage of GaAs enhancement mode devices. Typically, $V_{th}$ is 0.2 volts. However, worst case process variations may reduce this to 0.15 volts and the temperature dependence of the device may further reduce $V_{th}$ to as little as 75 millivolts. Thus, in order to fully turn off a MESFET with its source connected to ground, the gate must be pulled reliably below 75 millivolts. A logic input that is not sufficiently low to turn an output MESFET off hard results in sub-threshold leakage current in the channel of the pull-down MESFET, which reduces the output impedance of the circuit in the tri-state.

FIG. 6 illustrates a typical three state output buffer circuit for interfacing compound semiconductor digital logic circuits with silicon digital logic circuits, which is disclosed in U.S. Pat. No. 4,884,563 to MacMillan et al. The output buffer of FIG. 6 incorporates a tri-state input stage 70, three buffer stages 72, 74 and 76, and a standard totem pole output configuration 78. The output configuration 78 is based on MESFETs 80, 82 which pull an output 84 to the corresponding supply rail when turned on.

The output of the tri-state input stage 71 inverts the input level and applies it to the gates of four enhancement mode MESFETs 86, 88, 90, 92. These MESFETS have their sources connected to ground and their drains connected to the drains of MESFETs 98, 100, 102, 104, respectively, on the outputs of the stages 72, 74. Thus, a high voltage level to the tri-state input stage 71, is inverted to low, shutting off the MESFETs 86, 88, 90, 92 and allowing an input 73 of the buffer stage 72 to be passed to the output terminal 84. A low voltage level to the tri-state input stage 71 is inverted by that stage to a high logic state, which is applied to the gates of the MESFETs 86, 88, 90, 92, turning them on. As a result, point A, which is connected to the gate of the MESFET 80, is pulled low, shutting off the pull-up MESFET 80 and isolating the output 84 from the high voltage rail. Similarly, point B is pulled low, shutting off the pull-down MESFET 82.

Since the source of MESFET 82 is at ground, its gate must be pulled below ground to ensure that the MESFET 80 is shut off hard. The circuit of FIG. 6 ensures hard shut off by connecting an on-chip negative charge pump to the source of the depletion mode MESFET 96 via a resistor 97. With the depletion mode MESFET 96 biased into conduction, the negative charge pump ensures that the gate of the MESFET 82 is pulled below ground.

This use of the on-chip negative charge pump to ensure hard shut off of the pull-down MESFET 82 is a severely limited solution to the sub-threshold leakage problem. The charge pump occupies space on the chip and can only provide negative voltage to a limited number of driven outputs, since the current needed from the charge pump for a large number of outputs makes the charge pump circuit prohibitive.

SUMMARY OF THE INVENTION

The present invention is a method and apparatus for implementing silicon logic interface protocols in compound semiconductor technology with significant advantages over the prior art. Briefly, an input buffer circuit of the present invention converts the voltages corresponding to standard logic digital values to voltages appropriate to these digital values in compound semiconductor technology. The voltage of the converted logic level depends only on the difference between the input standard voltage level and a reference voltage which corresponds to the threshold voltage, $V_{th}$, of the silicon logic. Thus, the converted voltage is independent of device process, circuit temperature, and power supply output variations to first order. Signal levels appropriate to a variety of compound semiconductor technologies are available by a simple reconfiguration of the circuit. In addition, a source follower input is used so that the driving logic circuit need not source current to or sink current from the input buffer circuit. This eliminates the fanout limitation of prior art input buffer circuits.

In the preferred embodiment of the input buffer, the silicon logic input and a reference voltage ($V_{ref}=V_{th}$) are coupled to the input buffer circuit through the gates of a matched pair of depletion mode MESFETs which are wired as source followers. The source of each follower MESFET is connected through an identical diode and resistor chain to the drain of a second pair of MESFETs which form a current mirror. The input voltage is connected to the programming MESFET of the current mirror, creating a voltage at the drain of the second mirror MESFET that is proportional to the difference between the input and reference voltages. This voltage can then be input to a compound semiconductor digital logic circuit via either an inverting or a non-inverting buffer. The input buffer is protected from electrostatic discharge (ESD) via reverse biased diodes between the standard logic input and the two voltage supply rails.

An output buffer circuit of the present invention achieves a stable output buffer tri-state functionality and eliminates leakage current problems by a modification of the standard totem pole output configuration. This obviates the need for an on-chip charge pump with its attendant power and area consumption. In addition, sub-threshold leakage current in the logic gate driving the output pull-up MESFET is eliminated by a biasing scheme, resulting in greater switch dependability. The voltage swing of this logic gate is adjusted to allow rapid switching on high to low transitions.

In the preferred embodiment of the output buffer, a totem pole type output is modified to use two pull-down MESFETs, the gates of which are turned on and off concurrently. The drain of the first is connected to the output and its source is connected to the drain of the second MESFET. The source of the second MESFET is grounded and a current source is connected to its drain to provide leakage current to it when the pull-down pair is shut off. The voltage drop thus created across the second MESFET puts the source of the first MESFET at a small positive voltage. As a result, the gate-source diode is reverse biased, shutting the first pull-down MESFET off hard. This eliminates the leakage problem to which prior art circuits are prone.

Also, in the preferred embodiment, the logic gate controlling the output pull-up MESFET, which is referenced to $V_{cc}$, is returned to a small positive voltage. This ensures that the output voltage of the logic gate stabilizes at or near the positive supply voltage, ensuring sufficient voltage swing to turn on the pull-up MESFET. The output of the logic gate is also clamped at 3.6 volts, giving the pull-up MESFET a smaller voltage swing between high and low states and thus speeding up switching.

BRIEF DESCRIPTION OF THE DRAWINGS

FIG. 7 illustrates an input buffer circuit constructed in accordance with the present invention.

DETAILED DESCRIPTION OF THE PREFERRED EMBODIMENT

Figure 1:
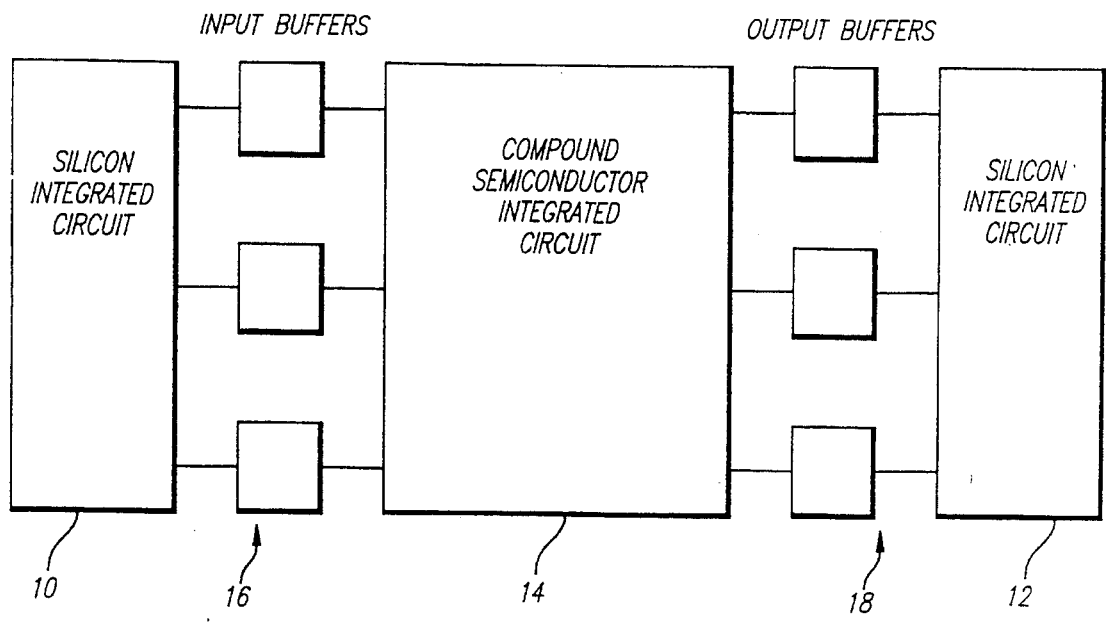
FIG. 1 is a block diagram of a typical system for interfacing silicon and compound semiconductor digital logic circuits.
Figure 5:
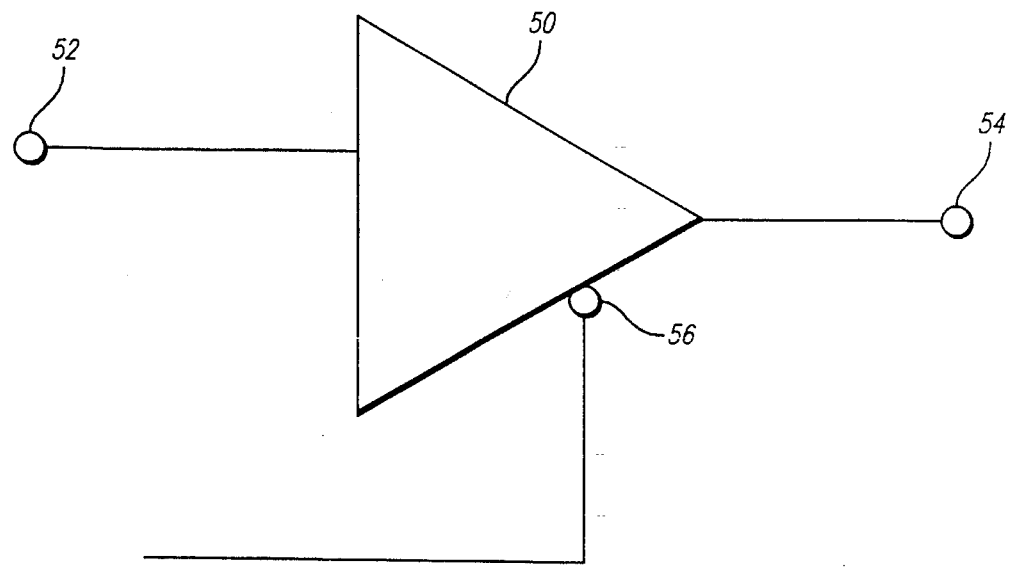
FIG. 5 shows a typical active high three state buffer circuit.
Figure 2:
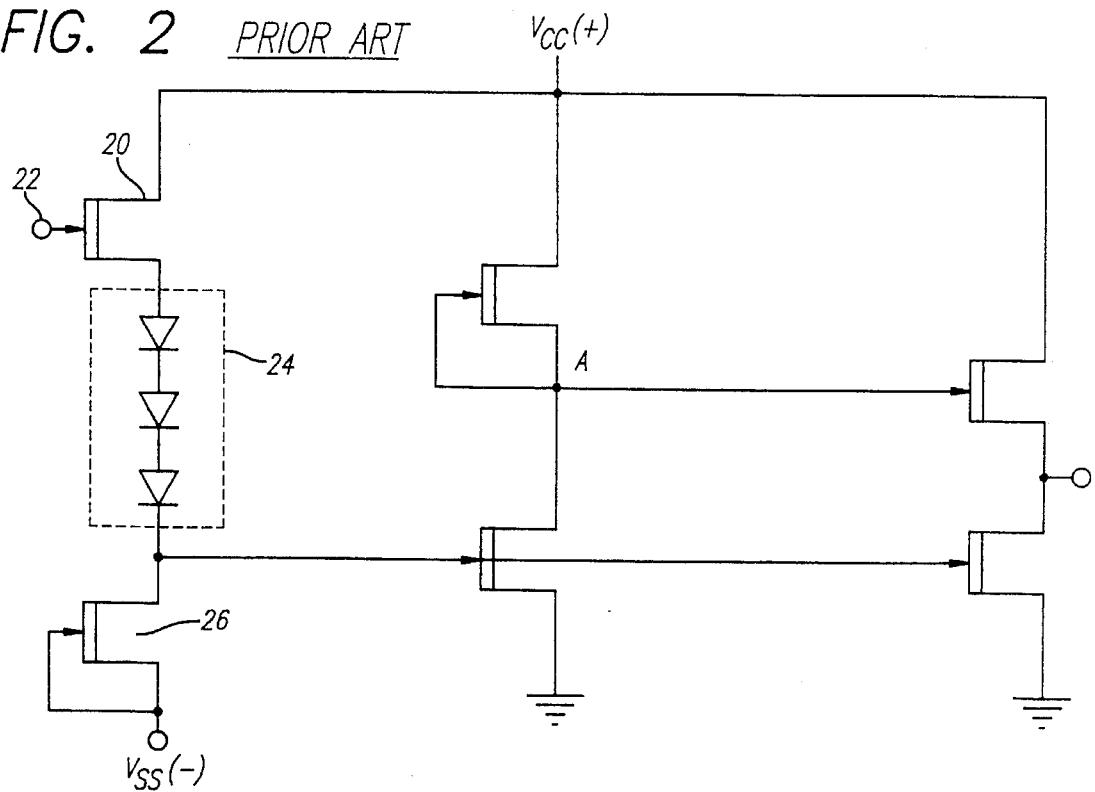
FIGS. 2 and 3 depict typical circuits for GaAs input buffers which are based on source follower MESFETs.
Figure 3:
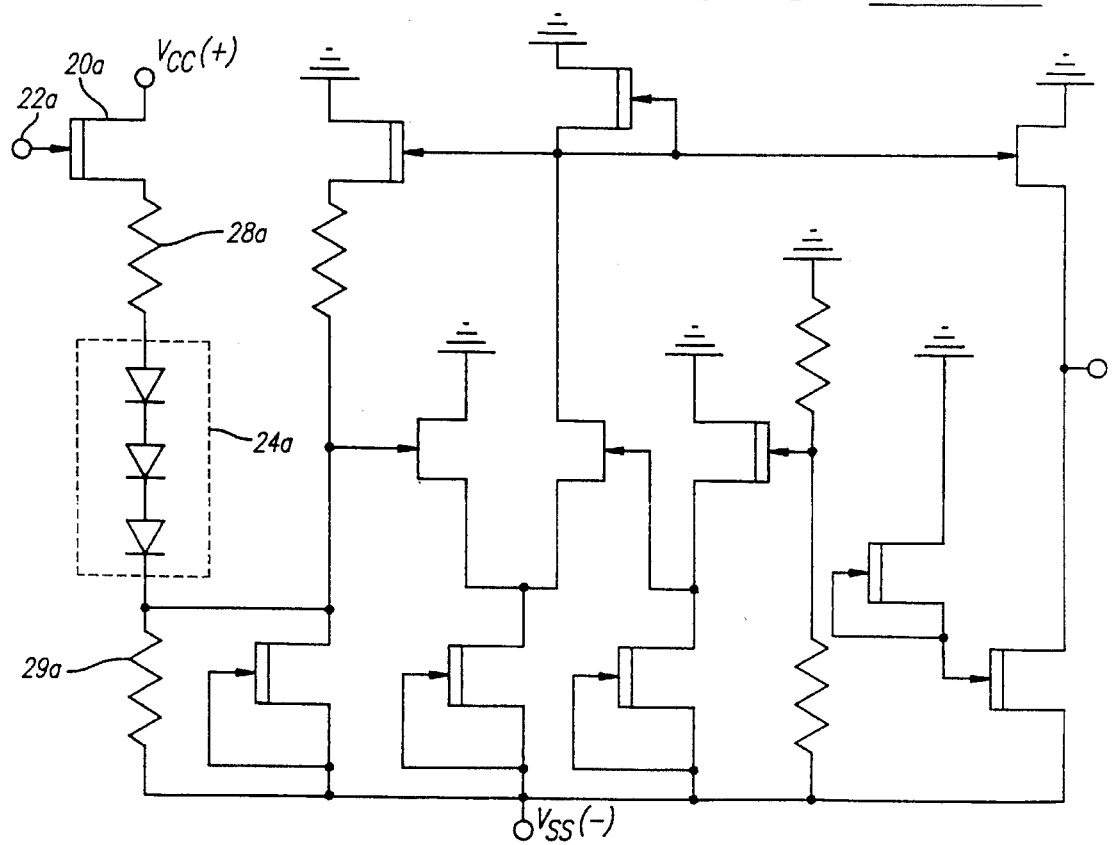

FIG. 1, described above, is an overview of a conventional system for combining digital logic circuits based on different semiconductor technologies. The present invention may be incorporated in such a system. The conventional system consists of typically three classes of circuits: input buffers 16, integrated circuit 14 based on compound semiconductor technology, for example, GaAs, and output buffers 18. Although the input buffers 16 and the output buffers 18 are shown separate from the integrated circuit 14, they are typically incorporated within the integrated circuit 14.

The input buffers 16 serve the dual function of buffering the logic signals input from standard logic and shifting the input voltages to logic levels within the protocol of the compound semiconductor logic of the integrated circuit 14. Similarly, the output buffers 18 shift the logic levels produced by the internal circuitry 14 to levels within the protocol of silicon logic and provide significant power amplification to drive external loads. The level shifts necessary for a given application depend on the digital logic family driving the inputs of the input buffers 16 and the digital logic family which comprises the integrated circuit 14 of FIG. 1.

Figure 7:
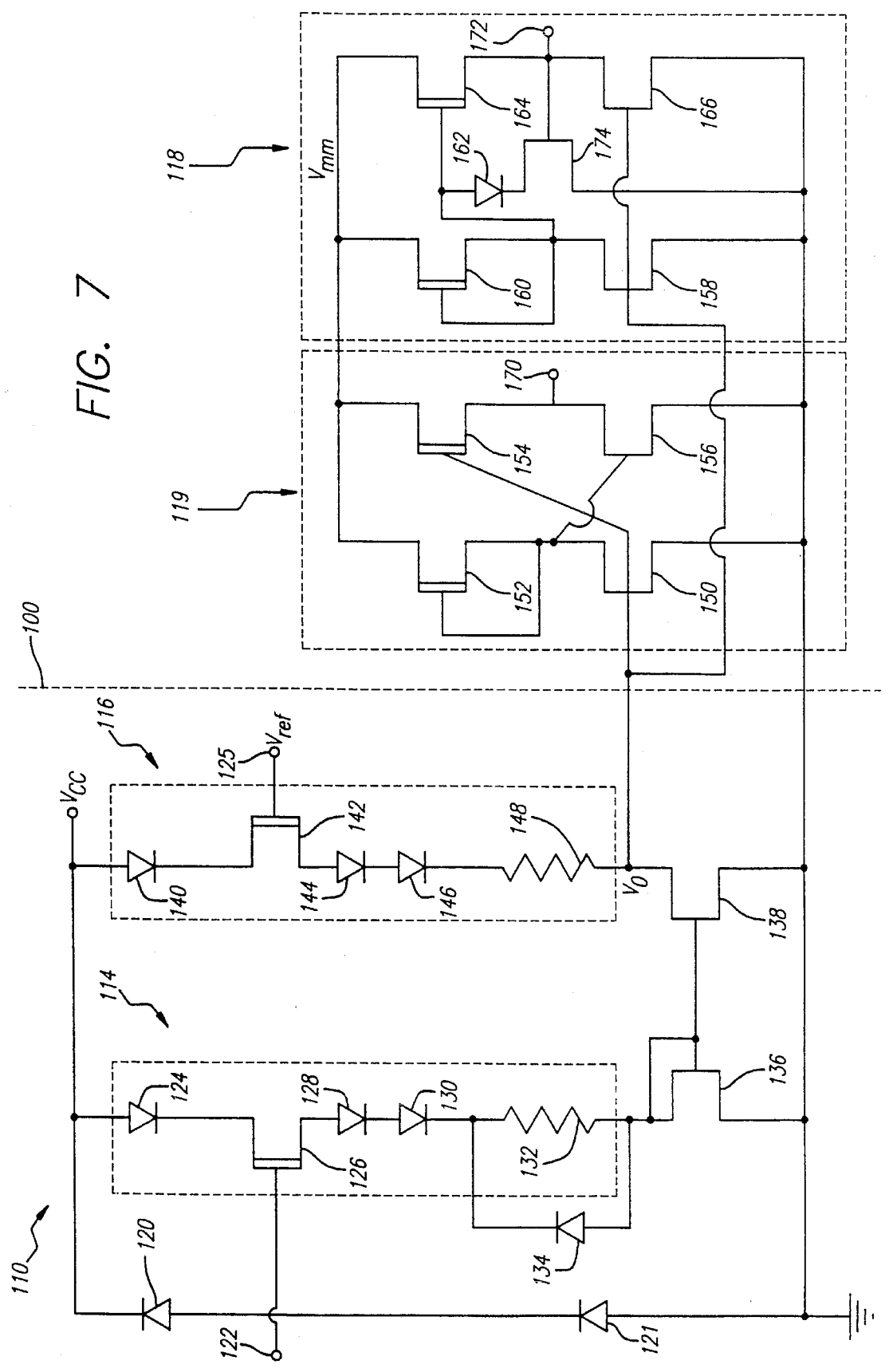

The preferred embodiment of an input buffer circuit will now be described in detail. FIG. 7 illustrates a circuit 110 for an input buffer constructed in accordance with the present invention. For convenience, the circuit 110 of FIG. 7 is described in two parts. The portion of the circuit 110 to the left of the broken line 100 shifts the input voltage levels, and the portion of the circuit 110 to the right of the broken line 100 buffers the shifted voltage with and without inversion to the integrated circuit 14.

The voltage shifting portion of the circuit 110 to the left of the broken line 100 will now be described. An input 122 of the circuit 110 is connected to the gate of a depletion mode MESFET 126 which is connected as a source follower. A diode 124, which is forward biased from the supply voltage $V_{cc}$ to ground, connects the supply voltage to the drain of the MESFET 126. The source of the MESFET 126 is connected via diodes 128, 130 and a resistor 132 to the drain of an enhancement mode MESFET 136. The diodes 124, 128, 130, the MESFET 126 and the resistor 132 form a first input chain 114.

A diode 140 connects the voltage supply $V_{cc}$ to the drain of a depletion mode MESFET 142. The source of the MESFET 142 is connected via diodes 144, 146 and a resistor 148 to the drain of an enhancement mode MESFET 138. The diodes 140, 144, 146, the MESFET 142 and the resistor 148 form a second input chain 116.

The component devices in the input chains 114, 116 are identically constructed. A reference voltage $V_{ref}$ corresponding to the threshold voltage $V_{th}$ of the logic family driving the input buffer circuit 16 (FIG. 1) is applied to the input 125 of the second input chain 116. In the case of a TTL driving circuit, for example, $V_{th}$ is 1.4 volts.

The drain of MESFET 136 is connected to its gate and to the gate of the matched enhancement mode MESFET 138, such that the transistor pair forms a current mirror. In this configuration, the current through the MESFET 136 is set by the voltage drop across the resistor 132, which in turn is determined by the input voltage at the input 122, less the gate-source voltage of MESFET 126 and the voltage drop across diodes 128, 130. The current mirror configuration imposes the gate-source voltage, $V_{gs}$ appropriate to this current on MESFET 138, thus generating the same drain current through MESFET 138.

The matched input chains 114, 116, terminating in the matched current mirror MESFETs 136, 138 create a balanced input circuit. Consequently, the MESFETs 136, 138 are sized so that when the voltage at the input 122 is equal to the threshold voltage at the input 125, the voltages on the drains of the MESFETs 136, 138 are equal to each other and equal to the trip point of the direct coupled FET logic (DCFL) present in the integrated circuit 14 (FIG. 1). In this manner, the voltage drops across the resistors 132, 148 will be identical and the voltage at the drain of the programmed MESFET 138 will be proportional to the difference between the voltage at the input 122 and the reference voltage $V_{ref}$ at the input 125.

This arrangement has the advantage of eliminating any variations in the shifted output voltage at the drain of MESFET 138, $V_o$, resulting from variations in the power supply, $V_{cc}$, or the circuit temperature. In addition, the balanced input circuit minimizes any variation in $V_o$ due to process variations in the devices since the devices are physically constructed next to one another, where the process parameters will be the same.

The shifted output voltage, $V_o$, can be easily adjusted for other logic levels by taking $V_o$ from any point along the matched second input chain 116. In addition, the circuit 110 can be made compatible with a driving circuit of any digital logic family by setting the reference voltage $V_{ref}$ to the threshold voltage appropriate to that logic family.

Figure 4:
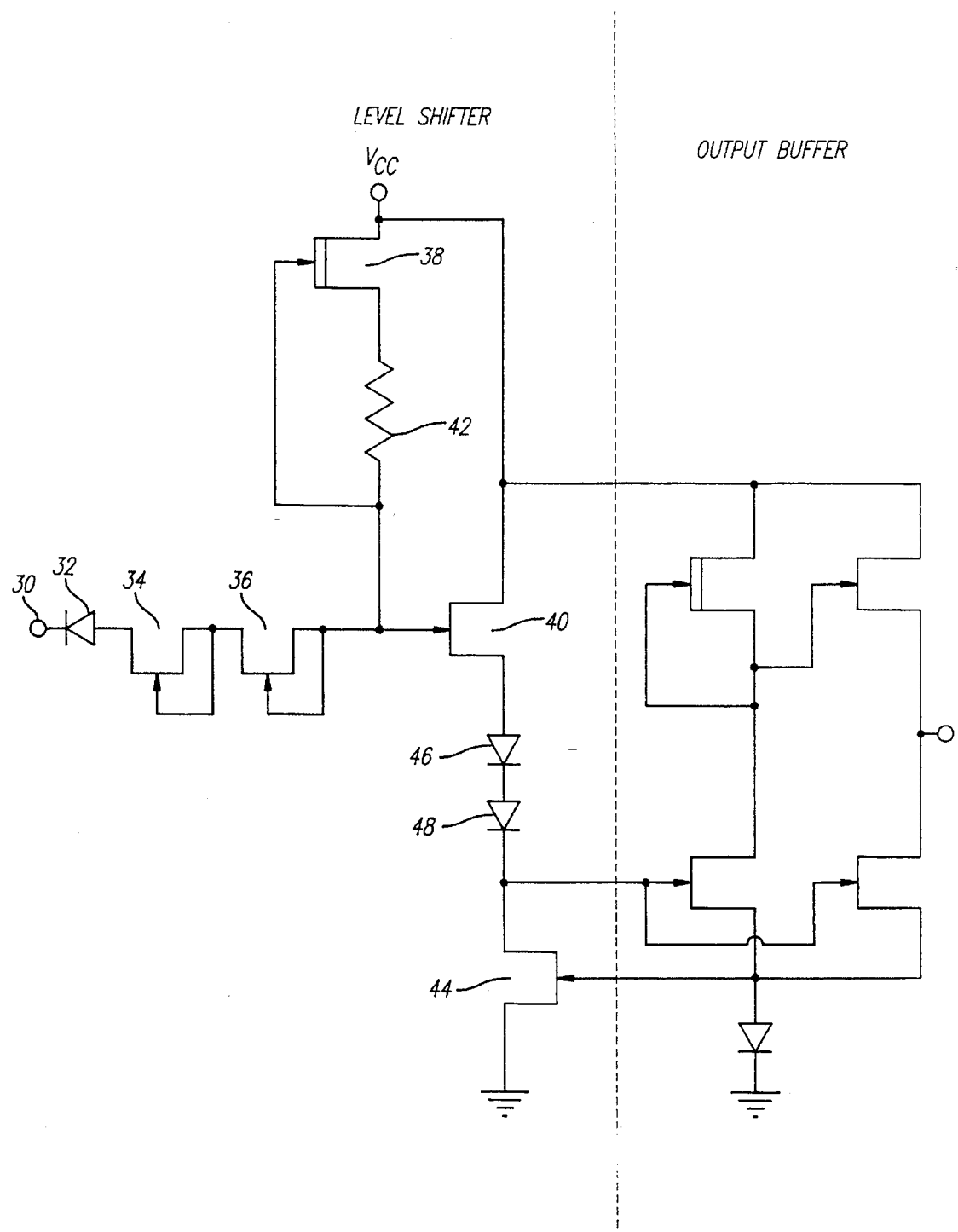
FIG. 4 depicts a typical circuit for GaAs input buffers which is based on a single power supply.
Figure 6:
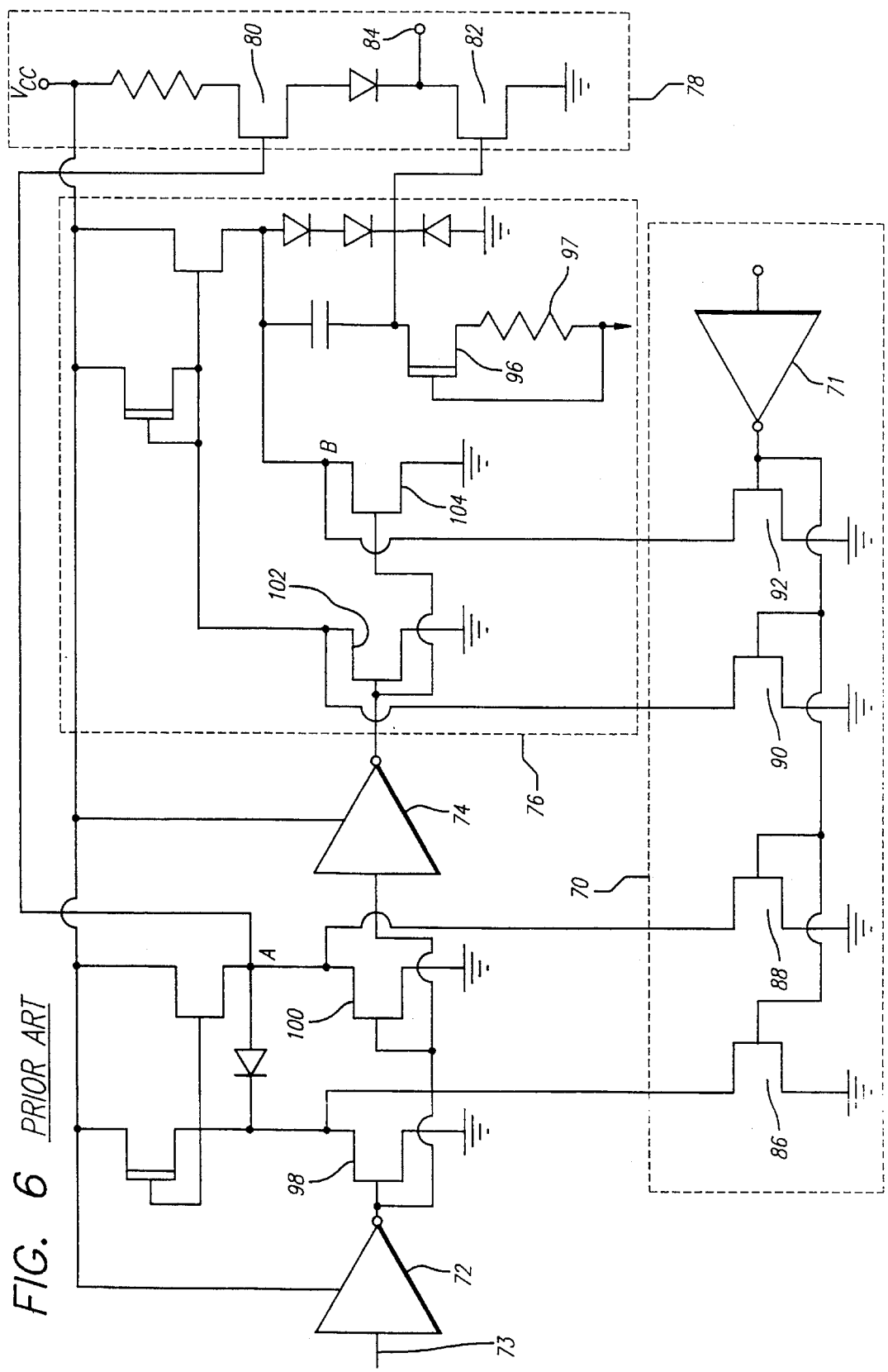
FIG. 6 illustrates a typical three state output buffer circuit for interfacing compound semiconductor digital logic circuits with silicon digital logic circuits.

Unlike the prior art circuit shown in FIG. 4, the level shifting portion of the circuit 110 does not source or sink current to the driving circuit. Thus, fanout is not limited by the driving source's ability to source or sink current to the circuit 110.

A diode 120 is connected in a reverse bias between the input 122 and the voltage supply. Similarly, a diode 121 is connected in a reverse bias between the input 122 and ground. The diodes 120, 121 clamp the input 122 to within one diode drop of either supply rail and protect the buffer components from damage due to high voltage inputs or electrostatic shocks.

The portion of the circuit 110 to the right of the broken line 100 will now be described. This portion of the circuit 110 consists of an inverting buffer 118 and a non-inverting buffer 119 for the output voltage $V_o$ of the level shifting portion of the circuit 110. In the preferred embodiment of the non-inverting buffer 119, the drain of a depletion mode MESFET 152 is connected to the voltage supply, $V_{mm}$. The gate of the MESFET 152 is connected to its source, biasing it into conduction. The drain of an enhancement mode MESFET 150 is connected to the source of the MESFET 152. The source of MESFET 150 is connected to ground and its gate is connected to $V_o$. A second depletion mode MESFET 154 has its drain connected to the high voltage supply, $V_{mm}$, and its gate connected to $V_o$. The source of MESFET 154 is connected to the drain of an enhancement mode MESFET 156, which has its source connected to ground and its gate connected to the gate of MESFET 152. An output 170 of the non-inverting buffer 119 is taken from the connection of the source of MESFET 154 and the drain of MESFET 156.

In the preferred embodiment of the inverting buffer 118, depletion mode MESFETs 160, 164 have their drains connected to the high voltage supply $V_{mm}$. The source of the MESFET 160 is connected to the drain of an enhancement mode MESFET 158 which has its source connected to ground. The gate of the MESFET 160 is connected to its source, to the gate of MESFET 164, and through a diode 162 to the source of enhancement mode MESFET 174. The source of MESFET 174 is connected to ground and an output 172 of the inverting buffer 118 is taken from the junction of the source of MESFET 164, the gate of MESFET 174 and the drain of MESFET 166. The source of MESFET 164 is connected to the drain of an enhancement mode MESFET 166 which also has its source connected to ground. The gates of the enhancement mode MESFETs 158, 166 are connected to $V_o$.

In operation of the circuit 110, if a voltage at the input 122 exceeds the reference voltage $V_{ref}$ (which is preferably the threshold voltage $V_{th}$ of the driving semiconductor technology) applied to the input 125, $V_o$ is reduced below the threshold voltage of the compound semiconductor logic. In the non-inverting buffer circuit 119, when $V_o$ drops below the threshold voltage of the compound semiconductor logic, MESFET 150 shuts off. This keeps the source of depletion mode MESFET 152 high, which in turn pulls the gate of MESFET 156 high, turning it on and pulling the non-inverting buffer output 170 low. Conversely, a low voltage at the input 122 causes $V_o$ to be high. When $V_o$ is high, MESFET 150 turns on, which pulls the gate of MESFET 156 low, turning it off. A high $V_o$ turns on the pull-up MESFET 154, pulling the non-inverting buffer output 170 high.

In the inverting buffer 118, when $V_o$ is low, MESFETs 158, 166 are turned off. This leaves the source of MESFET 160 high, turning on the pull-up MESFET 164 and pulling the output 172 high. When $V_o$ is high, the pull-down MESFET 166 is turned on, which pulls the output 172 low.

Figure 8:
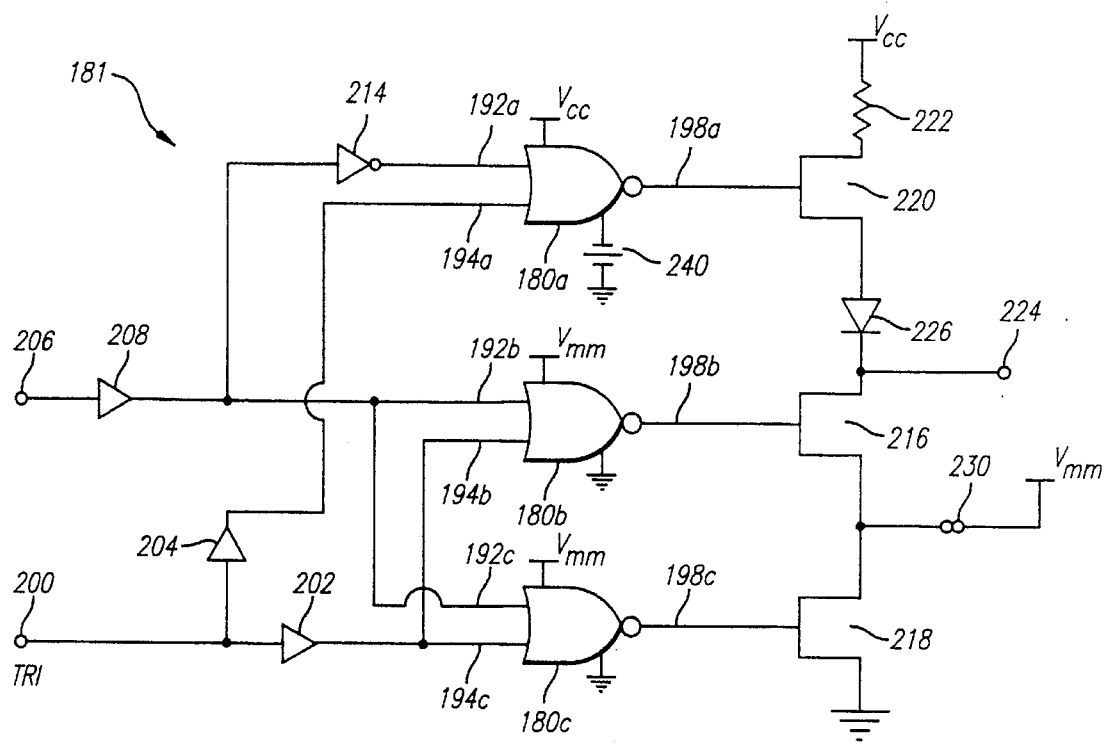
FIG. 8 illustrates an output buffer circuit constructed in accordance with the present invention.
Figure 9:
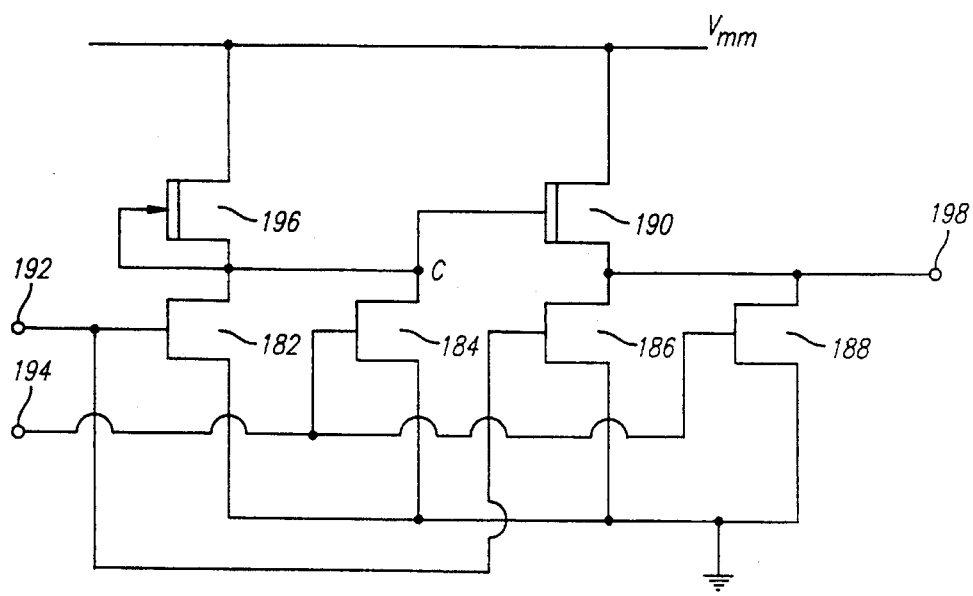
FIG. 9 illustrates the NOR logic gates of FIG. 8.

FIG. 8 shows a simplified schematic of an output buffer circuit 181 constructed in accordance with the present invention. NOR gates 180a, 180b, 180c all have the structure which is shown in FIG. 9. Referring to FIG. 9, the NOR gate circuit 180 consists of two depletion mode MESFETs 190, 196, the drains of which are connected to the supply voltage, $V_{mm}$ or $V_{cc}$, and the sources of which are connected to the drains of two enhancement mode MESFETs. The source of MESFET 190 is connected to the drains of enhancement mode MESFETs 186, 188 and the source of the MESFET 196 is connected to the drains of enhancement mode MESFETs 182, 184. From each of the enhancement mode MESFET pairs 186, 188 and 182, 184, the gate of one of the MESFETs 182, 186 is connected to the NOR gate input 192. The gate of the remaining MESFETs 184, 188 of each pair is connected to the other NOR gate input 194. The gate of the MESFET 196 is connected to its source and to the gate of the MESFET 190. An output 198 of the NOR gate is taken from the source of the MESFET 190.

When the NOR gate input 192 is high, the enhancement mode MESFET 182 is turned on, pulling point C low and shutting off the depletion mode MESFET 190. The high input at the NOR gate input 192 also turns on the enhancement mode MESFET 186 which connects the output 198 to ground. Since each of the MESFETs in the MESFET pairs 182, 184 and 186, 188 have identical connections except for the input that drives their gates, a high level at the input 194 accomplishes the same result as a high level at the input 192, sending the output 198 low. Consequently, when either or both of inputs 192, 194 are high, the output 198 is low.

When both NOR gate inputs 192, 194 are low, all of the MESFETS 182, 184, 186, 188 are turned off. The depletion mode MESFET 196 remains on since its gate must be back biased to turn off. Thus, point C is pulled to the voltage supply $V_{cc}$, turning on the MESFET 190, which pulls up the output 198 to the voltage supply $V_{cc}$. Thus, the output 198 is low if either or both inputs 192, 194 are high, and the output 198 is high only if both inputs 192, 194 are low.

Referring to the output buffer circuit 181 of FIG. 8, a tri-state input 200 is connected to single inputs 194a, 194b, 194c of each of three NOR gates 180a, 180b, 180c via buffers 202, 204. A signal input 206 is connected through a buffer 208 to inputs 192b, 192c of NOR gates 180b, 180c. An output 198b of the NOR gate 180b drives the gate of a first pull-down MESFET 216. The output 198c of the NOR gate 180c drives the gate of a second pull-down MESFET 218. Thus, the NOR gates 180b, 180c are switched high and low together, turning the pair of pull-down MESFETs 216, 218 on and off concurrently.

The signal input 206 is connected through a buffer 208 and an inverter 214 to an input 192a of the NOR gate 180a. The output 198a of the NOR gate 180a drives the gate of a pull-up MESFET 220. The drain of the pull-up MESFET 220 is connected to the high voltage supply, $V_{cc}$, through a resistor 222. The source of the MESFET 220 is connected to a buffer output 224 through a diode 226. The drain of the first pull-down MESFET 216 is connected to the buffer output 224 and its source is connected to the drain of the second pull-down MESFET 218. The source of the MESFET 218 is grounded and a current source 230 is connected between the drain of MESFET 218 and a voltage source, $V_{mm}$. The voltage, $V_{mm}$, can be derived from $V_{cc}$ or supplied from off the board.

With this configuration, when the tri-state input 200 is high (asserted), one input to each of the NOR gates 180a, 180b, 180c is high. Consequently, the output of each of the NOR gates 198a, 198b, 198c is low and the corresponding MESFETs 220, 216, 218 are shut off. Thus, the output 224 is in a high impedance state, isolated from both the voltage supply $V_{cc}$ and ground.

When tri-state input 200 is low (not asserted), the corresponding inputs 194a, 194b, 194c to each of the NOR gates 180a, 180b, 180c is low and the logic level of the signal input 206 determines the output state of the NOR gates 198a, 198b, 198c. If the signal input 206 is low, the inverter 214 puts the input 192a of the NOR gate 180a high, sending its output 198a low and shutting off the pull-up MESFET 220. At the same time, the inputs 192b, 192c of the NOR gates 180b, 180c are low, sending the outputs 198b, 198c high and turning on the pull-down MESFET pair 216, 218. Thus, with the tri-state input 200 low (not asserted) and the signal input 206 low, the output 224 is connected to ground, giving a low output to the circuits driven by the output buffer.

Conversely, if the signal input 206 is high when the tri-state input 200 is low (not asserted), the corresponding high signal on inputs 192b, 192c to the NOR gates 180b, 180c sends their outputs 198b, 198c low, shutting off the pull-down MESFET pair 216, 218. A high voltage at the signal input 206 is inverted by inverter 214 before being passed to the input 192a of NOR gate 180a. This sends the output 198a of the NOR gate 180a high, turning on the pull-up MESFET 220. Thus, with the tri-state input 200 low (not asserted), the output 224 is connected to the voltage supply $V_{cc}$, sending it high.

Figure 10:
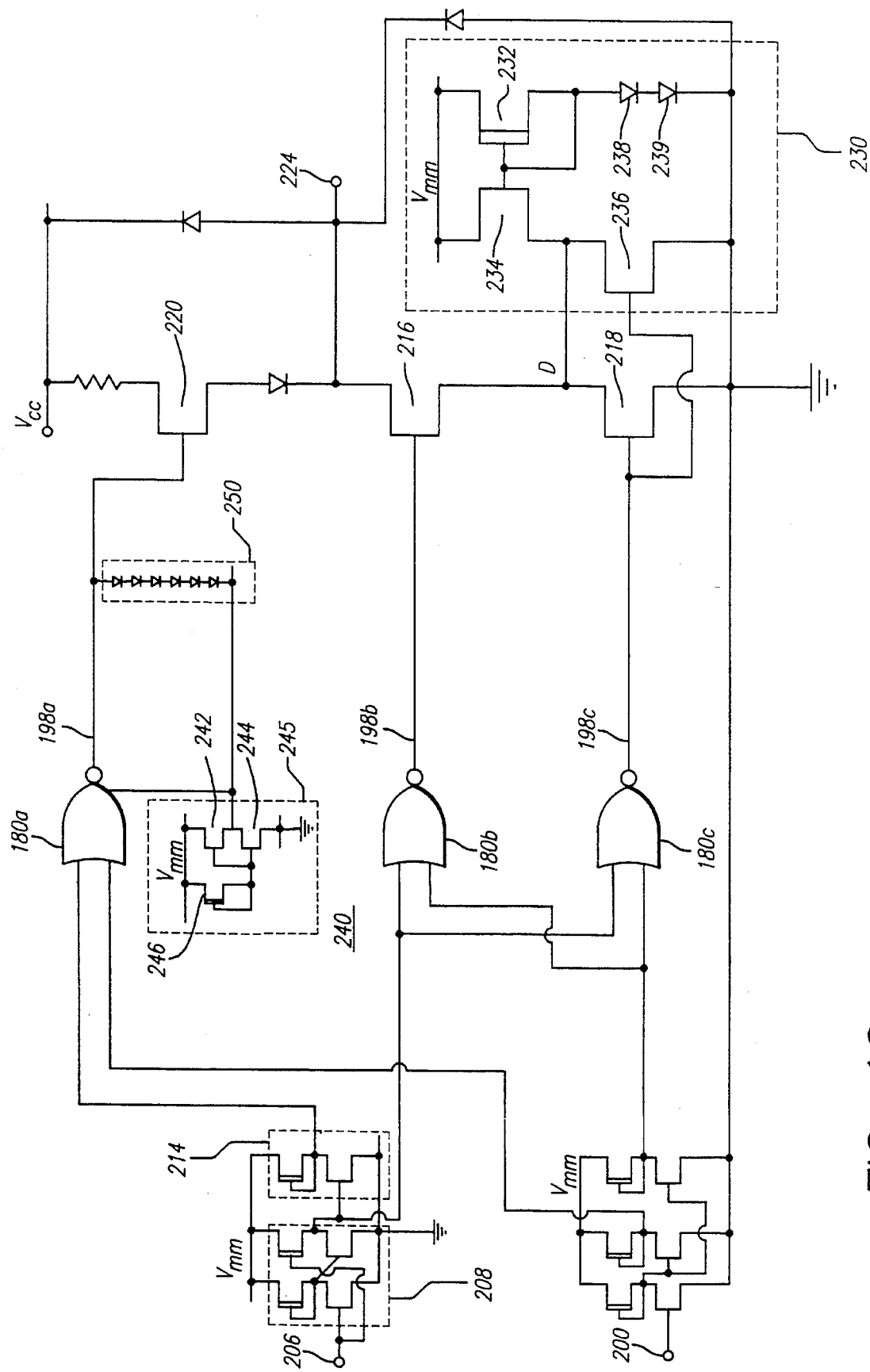
FIG. 10 illustrates an output buffer circuit constructed in accordance with an alternative embodiment of the present invention.

FIG. 10 is a more detailed schematic of the output buffer circuit 181 shown in FIG. 8. FIG. 10 shows in more detail two features of the output buffer circuit of the present invention which ensure stable, rapid switching. These features are the current source 230 for the lower pull-down MESFET 218 and a voltage supply 240 for the NOR gate 180a.

The current source 230 sources current to the drain of the second pull-down MESFET 218 through an enhancement mode MESFET 234. The MESFET 234 has its drain connected to $V_{mm}$ and its source connected to the drains of enhancement mode MESFET 236 and the second pull-down MESFET 218. The MESFET 236 has its gate connected to the NOR gate 180c which turns it on and off concurrently with the second pull-down MESFET 218. A depletion mode MESFET 232 has its drain connected to the voltage supply $V_{mm}$ and its source connected to ground through two diodes 238, 239. The gates of the MESFETs 232, 234 are connected together and are connected to the source of the depletion mode MESFET 232.

When the output 198c of the NOR gate 180c goes low, thereby shutting off the second pull-down MESFET 218, the MESFET 236 is also shut off. Any sub-threshold leakage current flowing in the second pull-down MESFET 218 due to incomplete shut off will be supplied through the current source MESFET 234. As discussed above, the leakage current flow through MESFET 218 puts its drain at a small positive voltage, reverse biasing the first pull-down MESFET 216 so that it is shut off hard. In this way, output 224 is at a stable high impedance. When the output 198c of NOR gate 180c goes high, both the second pull-down MESFET 218 and the current source MESFET 236 are turned on, pulling point D low, and allowing normal operation of the totem pole output.

The output 198a of the NOR gate 180a must swing high enough to turn on the pull-up MESFET 220 reliably. Since the MESFET 220 must pull the output 224 above the threshold voltage of the digital logic circuit(s) that it drives, the NOR gate 180a normally operates between the full supply voltage, $V_{cc}$, and ground. Referring to FIG. 9, sub-threshold leakage in the NOR gate MESFETs 186, 188 may cause the output 198 to settle at a voltage less than $V_{cc}$, thereby inhibiting reliable switching of the pull-up MESFET 220. In the present invention, therefore, the sources of MESFETs 182, 184, 186, 188 in the NOR gate 180a are connected to a small positive bias by means of the voltage supply 240. The positive voltage ensures that the MESFETs 182, 184, 186, 188 are turned off hard when their corresponding inputs 192, 194 are brought low.

In the preferred embodiment of the present invention, the voltage generator 240 includes an enhancement mode MESFET 242 which has its drain connected to the supply voltage, $V_{mm}$, and its source connected to the drain of a second enhancement mode MESFET 244. The drain of the second enhancement mode MESFET 244 is connected to ground and the gates of the MESFETs 242, 244 are connected to the source of a depletion mode MESFET 246. The gate of the depletion mode MESFET 246 is connected to its source, biasing the MESFET 246 into conduction. With this arrangement, the MESFETs 242, 244 are held on by the MESFET 246 and an output 248 of the voltage generator 240 floats a few hundred millivolts above ground.

A diode chain 250 connected between the voltage generator output 248 and the output 198a of the NOR gate 180a limits the voltage swing of the output 198a and, thus, speeds up the switch between high and low logic states.

What is claimed is:

1. An output buffer apparatus comprising:
   (a) an output section coupled to a first-power source, said output section further comprising:
      (i) a buffer output;
      (ii) a pull-up portion comprising a first current handling terminal coupled to said first power source, a second current handling terminal coupled to said buffer output, and at least one current controlling input; and
      (iii) a pull-down portion comprising:
         A. a first transistor comprising a current controlling input and a first current handling terminal coupled to said buffer output;
         B. a second transistor comprising a current controlling input, a first current handling terminal coupled to ground, and a second current handling terminal coupled to a second current handling terminal of said first transistor; and
         C. a current source comprising a current sourcing terminal coupled to said second current handling terminals of said first and said second transistors; and
   (b) a logic means comprising a tri-state input, a first control output coupled to said at least one current controlling input of said pull-up portion, a second at least one control output coupled to said current controlling input of said first transistor and coupled to said current controlling input of said second transistor, said logic means for turning off said first and said second transistors and said pull-up section when said tri-state input is receiving a first designated logic level.

2. The output buffer as recited in claim 1, wherein:
   (a) said logic means further comprises a plurality of logic gates;
   (b) a first of said plurality of logic gates generates said first control output; and
   (c) said first logic gate is coupled between said first power source and a second power source.

3. The output buffer as recited in claim 2, wherein a plurality of diodes are coupled between said first control output and said second power source.

4. The output buffer as recited in claim 2, wherein the positive terminal of said second power source is the output of a voltage generator coupled between a third power source and ground.

5. The output buffer as recited in claim 3, wherein when said tri-state input is receiving said second designated logic level, said logic means is also for turning off said first and said second transistors while turning on said pull-up portion when said data input is receiving said first designated logic level, and for turning on said first and said second transistors while turning off said pull-up portion when said data input is receiving said second designated logic level.

6. The output buffer as recited in claim 5, wherein said pull-up portion further comprises a pull-up transistor having a control terminal coupled to said first control output, a first current handling terminal coupled to said first power source and a second current handling terminal coupled to said buffer output.

7. The output buffer as recited in claim 6, wherein said first current handling terminal of said pull-up transistor is coupled to said first power source through a resistive element and said second current handling terminal of said pull-up transistor is coupled to said buffer output through a diode.

8. The output buffer as recited in claim 7, wherein said second at least one control output is generated by a second at least one of said plurality of logic gates coupled to said tri-state and said data inputs, said second at least one of said plurality of logic gates coupled to said third power source.

9. The output buffer as recited in claim 8, wherein said plurality of logic gates and said voltage generator are comprised of a plurality of MESFET transistors and said first, said second and said pull-up transistors are MESFETS.

10. A method of buffering logic signals using a buffer circuit comprising a totem pole section and a logic section, said totem pole section comprising a pull-up circuit, said pull-up circuit coupled between the positive terminal of a first power supply and a buffer output, said totem pole section further comprising a first transistor and a second transistor, said first transistor having a first current conducting terminal coupled to said buffer output, said second transistor having a first current conducting terminal coupled to ground and a second current conducting terminal coupled to a second current conducting terminal of said first transistor, said logic section comprising a tri-state input, a data input, a first control output coupled to a current controlling input of said pull-up circuit and at least one second control output coupled to a current controlling input of each of said first and said second transistors, said method comprising the steps of:
   (a) operative when said tri-state input is receiving a first designated logic level:
      i) turning off said pull-up circuit to create a substantially open circuit between said first power source and said buffer output,
      ii) turning off said first and said second transistors to create a substantially open circuit between said buffer output and ground, and
      iii) providing an external source of subthreshold leakage current to said second current conducting terminal of said second transistor as an alternative source to said first transistor to ensure that said first transistor is turned off hard;
   (b) operative when said tri-state input is receiving a second designated logic level and said data input is receiving said first designated logic level:
      i) turning on said pull-up circuit to pull said buffer output substantially up to said first power source, and
      ii) turning off said first and said second transistors to create a substantially open circuit between said buffer output and ground; and
   (c) operative when said tri-state input and said data input are both receiving said second designated logic level:
      i) turning off said pull-up circuit to create a substantially open circuit between said first power source and said buffer output, and
      ii) turning on said first and said second transistors to pull said buffer output substantially down to ground.

11. The method as recited in claim 10 wherein said logic section further comprises a first logic circuit having an output coupled to said first control output, said first logic circuit comprising a plurality of pull-down transistors, said step of turning on said pull-up circuit further including the step of operating said first logic circuit between said first power source and a voltage sufficient to shut off said plurality of pull-down transistors hard.

12. The method as recited in claim 10 wherein said step of turning off said first and said second transistors to create a substantially open circuit between said buffer output and ground, operative when said tri-state input is receiving said second designated logic level and said data input is receiving said first designated logic level, further comprises the step of providing an external source of subthreshold leakage current to said current conducting terminal of said second transistor as an alternative source to said first transistor to ensure that said first transistor is turned off hard.

13. The method as recited in claim 12 wherein said buffer circuit comprises MESFET transistors.

14. The method as recited in claim 11 wherein said buffer circuit comprises MESFET transistors.

15. The method as recited in claim 13 wherein said first control output clamped to limit its voltage swing between said first and said second designated logic levels.

16. The method as recited in claim 14 wherein said first control output is clamped to limit its voltage swing between said first and said second designated logic levels.

17. The output buffer as recited in claim 1 wherein said second at least one control output comprises a second and a third control output and wherein said second at least one of said plurality of logic gates comprises a second and a third logic gate, said second control output generated by said second logic gate and said third control input generated by said third logic gate.

18. The output buffer as recited in claim 1 wherein current from said current source positively biases said second current handling terminal of said second transistor to turn off said first transistor hard when said logic means turns off said first and said second transistors.

19. The output buffer as recited in claim 5 wherein said second at least one control output is also coupled to said current source, said logic means also for turning off said current source when turning on said first and said second transistors.

20. The output buffer as recited in claim 19 wherein said current source comprises a current mirror, said current mirror coupled to said third power source and further comprising MESFET transistors.

* * * * *